(12) United States Patent
Tokutome et al.

(10) Patent No.: US 6,727,584 B2
(45) Date of Patent: Apr. 27, 2004

(54) SEMICONDUCTOR MODULE

(75) Inventors: Hiroto Tokutome, Hyogo (JP); Takuya Ariki, Hyogo (JP)

(73) Assignee: Renesas Technology Corp., Tokyo (JP)

(*) Notice: Subject to any disclaimer, the term of this patent is extended or adjusted under 35 U.S.C. 154(b) by 15 days.

(21) Appl. No.: 10/264,025

(22) Filed: Oct. 4, 2002

(65) Prior Publication Data

US 2003/0189816 A1 Oct. 9, 2003

(30) Foreign Application Priority Data

Apr. 3, 2002 (JP) ........................................ 2002-101283

(51) Int. Cl.⁷ .............................................. H01L 23/34
(52) U.S. Cl. ........................ 257/724; 257/723; 257/787
(58) Field of Search ................................ 257/698, 723, 257/724, 787

(56) References Cited

U.S. PATENT DOCUMENTS

| | | | | |
|---|---|---|---|---|
| 4,721,995 A | * | 1/1988 | Tanizawa | 257/777 |
| 5,191,404 A | * | 3/1993 | Wu et al. | 257/724 |
| 5,366,906 A | * | 11/1994 | Wojnarowski et al. | 438/17 |
| 6,159,767 A | * | 12/2000 | Eichelberger | 438/107 |
| 6,228,546 B1 | * | 5/2001 | Kashizaki et al. | 430/58.25 |
| 6,610,934 B2 | * | 8/2003 | Yamaguchi et al. | 174/264 |

FOREIGN PATENT DOCUMENTS

| | | |
|---|---|---|
| JP | 8-153846 | 6/1996 |
| JP | 10-256474 | 9/1998 |

\* cited by examiner

*Primary Examiner*—S. V. Clark
(74) *Attorney, Agent, or Firm*—McDermott, Will & Emery

(57) ABSTRACT

A plurality of electrical wires are provided on a rear surface of a semiconductor module substrate having a structure that it is possible to mount a repair chip having a long lead and a repair chip having a normal lead in an overlaying manner and that it is possible to provide either repair chip or repair chip, which correspond to a plurality of bare chips, respectively. Thereby, it is possible to obtain a semiconductor module capable of repairing in a case where any bare chip becomes defective or even in a case where any combination of bare chips becomes defective.

8 Claims, 31 Drawing Sheets

SEMICONDUCTOR MODULE

BACKGROUND OF THE INVENTION

1. Field of the Invention

The present invention relates to a semiconductor module such as an MCP (Module Chip Package) in which a semiconductor chip is mounted on a module substrate and is molded in a resin.

2. Description of the Background Art

A semiconductor memory device is utilized in a personal computer, a workstation and the like in some cases. In addition, in recent years the speed, degree of compactness and number of functions of personal computers have increased and, therefore, semiconductor memory devices have been required to further increase their memory capacity. In addition, the market has expanded so that a large number of low-cost memory devices are used. Therefore, further increase in the capacity of, and further reduction in costs of, semiconductor memory devices have become required.

The number of DRAMs (Dynamic Random Access Memory), from among the above described semiconductor memory devices, utilized in personal computers or the like has increased because it is advantageous from the point of view of cost per bit unit. Cost per bit unit can be reduced by increasing the diameter of wafers even in the case that the capacity is increased and, therefore, DRAMs are frequently utilized.

In a DRAM, however, cost of development, cost for high level institutions, and the like, have greatly increased together with the increase in the testing period of time and test costs accompanying the increase in capacity as well as the enhancement of microscopic processing technology so that whether or not those costs can be reduced has become a problem.

The bit configuration for the input to or output from a DRAM is conventionally 4 bits, 8 bits or 16 bits. Therefore, the variety in types of bit numbers is small. Accordingly, one module is made up of a plurality of DRAMs for general utilization. Thus, a semiconductor memory device such as a DRAM is, in many cases, utilized in a module condition.

FIGS. 27 and 28 show an example of a conventional semiconductor module (memory module). The conventional semiconductor module has a structure, wherein single chips 117, in which bare chips 101, mounting islands 118, bonding wires 105 and lead frames 110 are molded into mold resin 108, are mounted on both, front and rear, sides of a module substrate 102, such as of an SOP (Small Outline Package) or a TSOP (Thin Small Outline Package) corresponding to a surface mounting technology wherein parts can be mounted on both sides of a printed circuit board.

In addition, development has progressed of a memory package having a basic tendency toward miniaturization and thinning together with enhancement of performance and of functions of a memory chip. Then, though an insertion system was adopted for a memory package, in recent years the forms of packages have greatly changed such that a surface mounting system has been adopted.

At present, the surface mounting system has become the main trend in place of the insertion system and further miniaturization and lightening of a package are strongly required. Up to the present, simplification of design and increase in reliability, as well as reduction in cost, have been achieved by utilizing a semiconductor module In addition, in a conventional manufacturing process of a semiconductor module, in the case that a defective chip is discovered in a module test after the manufacture of a semiconductor module, testing and replacement of such a defective chip are carried out until such defect has been removed.

As described above, there is a problem with the conventional semiconductor module wherein a plurality of single memory chip ICs (Integration Circuits) in the form of packaged single chips 117 are mounted on semiconductor module substrate 102, as shown in FIGS. 27 and 28, and therefore, the mounting area of the single memory chip ICs becomes large.

Thus, in the present application, the inventors examined the case wherein a plurality of bare chips 101 provided in semiconductor module substrate 102 was integrally covered with mold resin 108, as shown in FIG. 29, thereby enhancement in the degree of compactness of the semiconductor device was achieved.

In the case that the plurality of bare chips 101 provided in semiconductor module substrate 102 is integrally covered, as shown in FIG. 29, with mold resin 108, however, there is a problem wherein a great amount of time and effort are required for the replacement of a memory chip that has been detected as being defective according to the conventional manufacturing process of a semiconductor module. Furthermore, though there is a memory module in the form of a COB (Chip On Board) as a semiconductor module with which high density mounting can easily be carried out, there is a problem wherein a bare chip 101 that has been detected as being defective cannot be repaired after bare chips 101 have been sealed into mold resin 108 according to the conventional module in the form of a COB.

A first object of the present invention is to provide a semiconductor module wherein repair becomes possible by newly mounting a good chip even in the case that a chip defect is detected after the chips have been molded into mold resin.

A method that has been examined by the inventors in this specification, as described above, of repairing a semiconductor module in which a plurality of bare chips are mounted by using a good chip is explained in reference to FIGS. 29 to 32. As shown in FIGS. 29 to 32, a plurality of bare chips (chips in the condition of having been cut out from a wafer) is aligned so that the plurality of bare chips are integrally sealed in mold resin 108. Then, a repair chip mounting region secured for mounting, in the case that there is a defective bare chip 101 on the front surface of semiconductor module substrate 102, a single chip 117, which is a good product, is formed on the rear surface of semiconductor module substrate 102 in which the plurality of bare chips 101 are molded. A single chip 117, wherein a conventional bare chip, alone, is sealed into a mold having a lead frame, is usually mounted in the above region.

In such a case as is described above, however, the pitch between the plurality of bare chips 101 and the pitch between a plurality of single chips 117 mounted as repair chips (single molded product) differ from each other as shown in FIG. 32. Therefore, the number of bare chips 101 that can be mounted on the front surface of semiconductor module substrate 102 and the number of single chips 117 that can be mounted on the rear surface differ from each other.

Accordingly, semiconductor module substrate 102 is considered to have a structure wherein, in the case that a plurality of bare chips 101 from among the entirety of the plurality of bare chips 101 becomes defective, there is a case wherein a plurality of single chips 117 that performs substitute functions cannot, depending on the combination of that plurality of defective bare chips 101, be mounted. For example, a case can be considered wherein semiconductor module substrate 102 has a structure on which single chips 117, respectively, that substitute for two bare chips 101 adjoining each other, respectively, cannot be mounted.

In addition, semiconductor module substrate 102 is, for example, considered to have a structure wherein, in the case that the entirety of the plurality of bare chips 101 mounted on semiconductor module substrate 102 becomes defective, it becomes impossible to mount all of the good chips that perform functions substituting for that entirety of bare chips 101. More concretely, in regard to semiconductor module substrate 102 shown in FIG. 32, in the case that the maximum number of bare chips 101 that can be mounted is 12, only eight single chips 117, at a maximum, can be mounted as repair chips. Accordingly, the entirety of repair chips 103, respectively corresponding to the entirety of bare chips 101, cannot be mounted and, therefore, bare chips 101 remain when the single chips 117 that substitute for corresponding functions cannot be mounted.

SUMMARY OF THE INVENTION

A first object of the present invention is to provide a semiconductor module wherein repair becomes possible by newly mounting a good chip even in the case that a chip defect is detected after the chips have been molded into mold resin.

A second object of the present invention is to provide a semiconductor module wherein the semiconductor module can be repaired in the case that any bare chip becomes defective and in the case that any combination of bare chips becomes defective. Thereby, the yield of a semiconductor module as a product is increased.

A semiconductor module of the present invention is provided with a semiconductor module substrate, a plurality of bare chips mounted on the main surface of the semiconductor module substrate, and a mold resin for covering the plurality of bare chips together with the main surface of the semiconductor module substrate. In addition, the semiconductor module substrate includes a plurality of repair chip mounting regions provided outside of the mold resin that are regions wherein repair chips that can be used in place of the plurality of bare chips, respectively, and that have input/output terminals can be mounted. Furthermore, the semiconductor module includes a plurality of electrical wires which, in the case that any of the plurality of bare chips is detected as being defective and a repair chip is mounted on any of the plurality of repair chip mounting regions, is connected to the input/output terminals of the mounted repair chip so that electrical signals that have been inputted to or outputted from the bare chip that has been detected as being defective are inputted to or outputted from the mounted repair chip via the input/output terminals. In addition, the semiconductor module is formed so that the above described plurality of electrical wires is connectable to input/output terminals of a repair chip that is used in place of an arbitrary bare chip selected from among the plurality of bare chips or connectable to respective input/output terminals of a repair chip that is used in place of an arbitrary combination of bare chips, respectively, selected from the plurality of bare chips.

According to the above described configuration, a repair chip can be mounted on any of the plurality of repair chip mounting regions in place of a bare chip that has become defective from among the plurality of bare chips and, thereby, the semiconductor module can be repaired after the bare chips are sealed in resin. Therefore, bare chips other than the bare chip that has become defective from among the plurality of bare chips can be effectively utilized.

Furthermore, the plurality of electrical wires is formed so as to be connectable to input/output terminals of a repair chip that is used in place of an arbitrary bare chip selected from among the plurality of bare chips or connectable to respective input/output terminals of a repair chip that is used in place of an arbitrary combination of bare chips, respectively, selected from the plurality of bare chips. Therefore, the semiconductor module can be repaired in the case that any bare chip from among the plurality of bare chips becomes defective or in the case that any combination of plural bare chips from among the plurality of bare chips becomes defective.

A repair chip of the semiconductor module of the present invention may be a single repair chip wherein a bare chip is sealed in resin and a lead frame is provided. In addition, the semiconductor module may be formed so that, in the case that single repair chips are mounted in an overlapping manner in the direction perpendicular to the main surface of the module substrate so as to have a stacked structure, it is possible to connect the plurality of electrical wires to the input/output terminals of the respective single repair chips in the stacked structure.

According to the above described configuration, the number of single repair chips mounted on the main surface of the semiconductor module substrate can be increased per unit area.

A repair chip of the semiconductor module of the present invention may be a double capacity repair chip having a memory capacity two times as large as that of a bare chip, which is a single repair chip wherein a bare chip is sealed in resin and a lead frame is provided. In addition, the semiconductor module may be formed so that it is possible for the plurality of electrical wires to be connected to the input/output terminals of a double capacity repair chip that is used in place of any two bare chips from among the plurality of bare chips.

According to the above described configuration, the semiconductor module can be repaired when two bare chips have become defective in the case that one double capacity repair chip is mounted and, therefore, labor needed for mounting a repair chip can be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, semiconductor modules of the embodiments of the present invention will be described in reference to FIGS. 1 to 27.

(First Embodiment)

First, a semiconductor module of the first embodiment will be described in reference to FIGS. 1 to 5.

Figure 1:
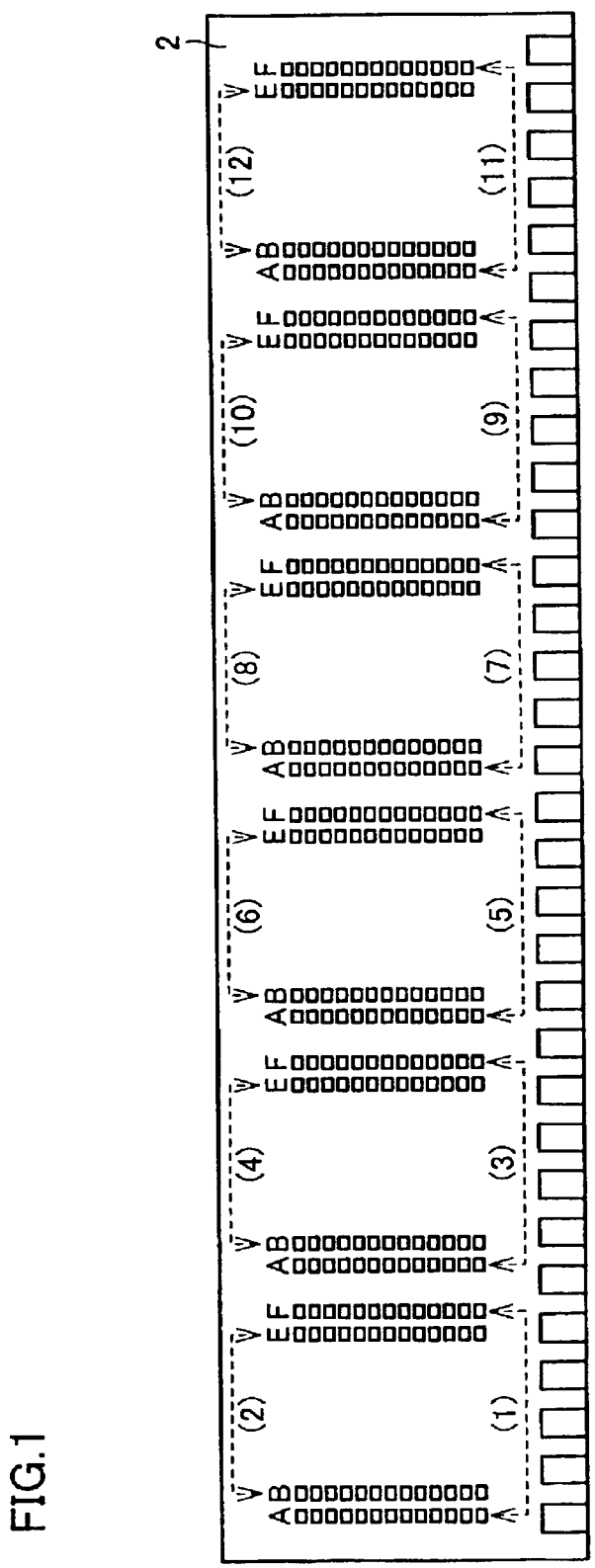
FIGS. 1 to 5 are views for describing a semiconductor module substrate of a first embodiment.

FIG. 1 shows a semiconductor module substrate on which a single repair chip used in the semiconductor module of the present embodiment is mounted. In addition, lead connection parts A to F, made of pads to which lead frames of single repair chips are connected, are provided on semiconductor module substrate 2.

Figure 2:
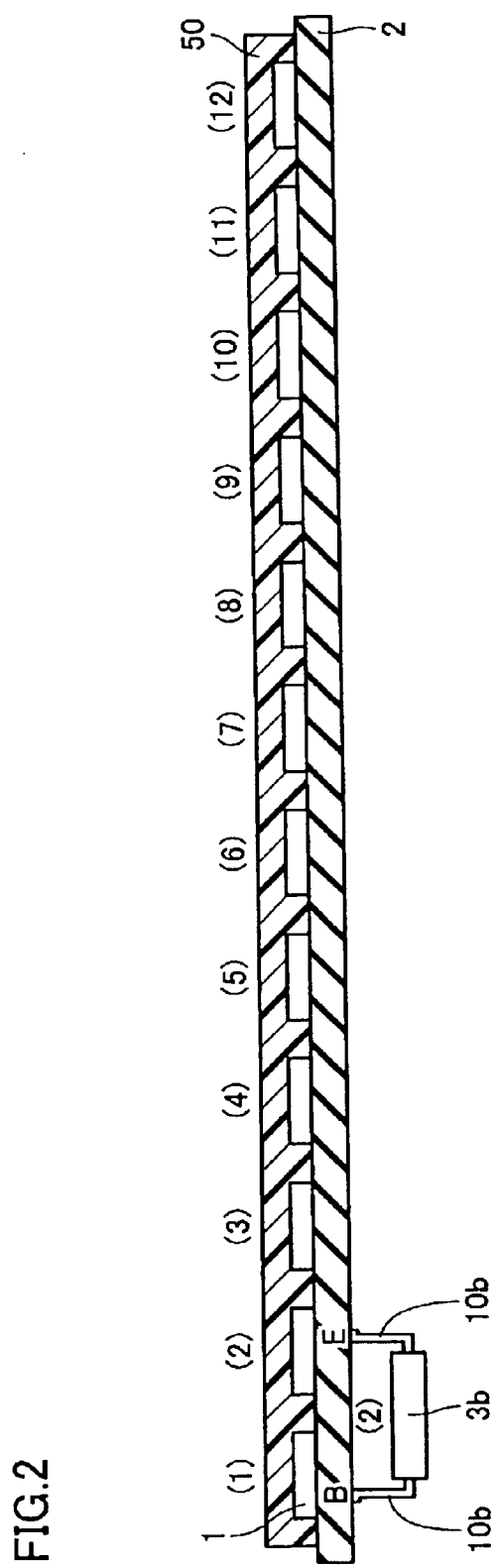

In the semiconductor module of the present embodiment, in the case that a bare chip that has become defective is detected, the semiconductor module is repaired by using a good single chip. As for this good single chip, a conventional single mold product, as shown in FIG. 2, that is to say, a single repair chip 3b, wherein a single bare chip is sealed in a mold and a lead frame of a conventional length is provided, is used. In addition, as for the good single chip, a single mold product having long leads, longer than those of a conventional lead frame as shown in FIG. 3, that is to say, a single repair chip 3a, wherein a single bare chip is sealed in a mold and a lead frame longer than a lead frame of a conventional length is provided, is also used.

Figure 4:
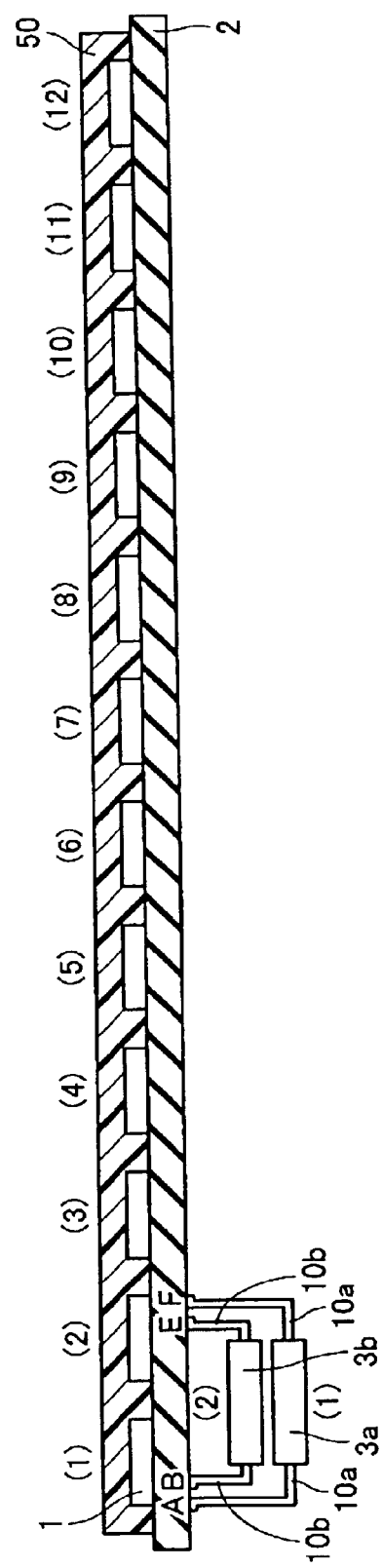

In addition, module substrate 2 shown in FIG. 1 is formed so that, in the case that repair chip 3a and repair chip 3b are mounted in an overlapping manner so as to have a stacked structure wherein single chips are mounted in an overlapping manner in the direction perpendicular to the main surface of module substrate 2 as shown in FIG. 4, the lead frames of the respective bare chips and lead connection parts A to F provided on module substrate 2, respectively, are connected.

Here, in the semiconductor module of the present embodiment, a single mold product having a conventional lead frame is referred to as a "single normal lead product" and a single mold product having a long lead frame, which is longer than a conventional lead frame, is referred to as "single long lead product." Accordingly, repair chip 3b made of a single normal lead product has normal leads 10b. In addition, repair chip 3a made of a single long lead product has long leads 10a.

Figure 3:
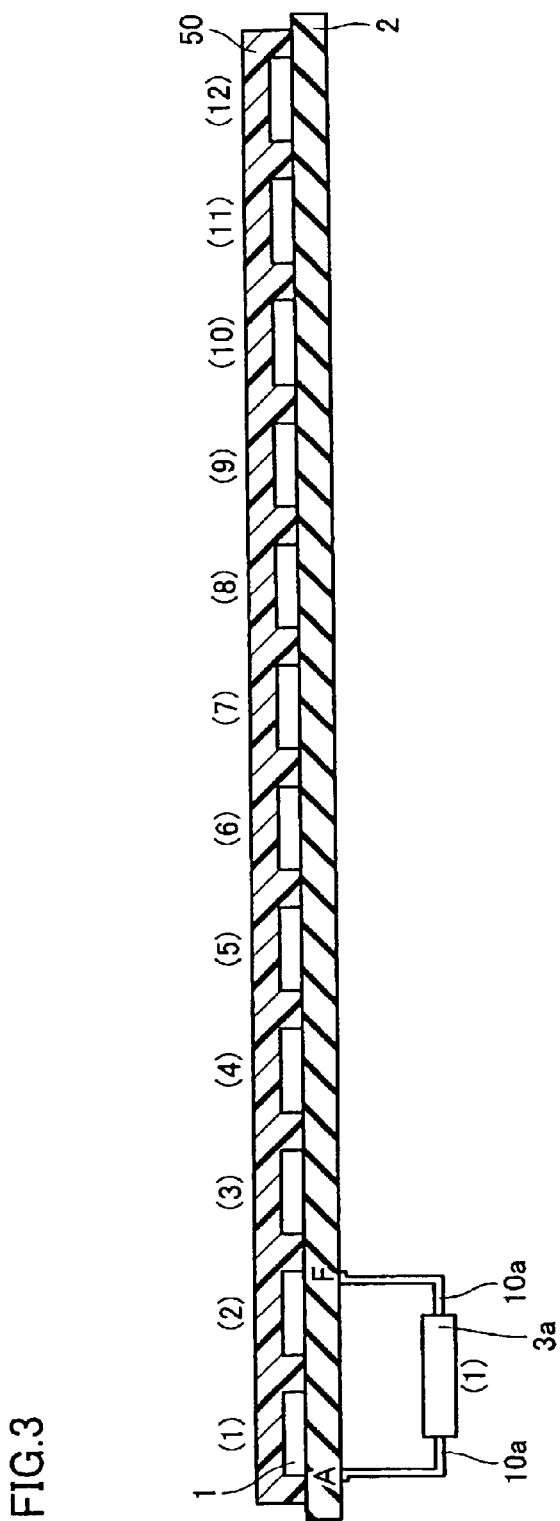

In FIGS. 1 and 3, lead connection parts A and F provided on module substrate 2 are portions wherein the lead frame of repair chip 3a is connected in the case that repair chip 3a-(1) is used in place of bare chip 1-(1). In this case, long leads 10a, of repair chip 3a, made of a single long lead product are connected to lead connection parts A and F. In addition, in place of bare chips 1-(3), (5), (7), (9) and (11), respectively, shown in FIG. 3, repair chips 3a-(3), (5), (7), (9) and (11), respectively, are mounted to locations on module substrate 2 of FIG. 1 that correspond to these numbers, thereby the semiconductor module is repaired.

In addition, in reference to FIGS. 1 and 2, lead connection parts B and E provided on module substrate 2 are parts to which a lead frame is connected in the case that repair chip 3b made of a single normal lead product is used in place of bare chip 1-(2). In this case, normal leads of repair chip 3b, made of a single normal lead product, are connected to lead connection parts B and E. In place of bare chips 1-(4), (6), (8), (10) and (12), respectively, shown in FIG. 2, repair chips 3b-(4), (6), (8), (10) and (12), respectively, are mounted to locations on module substrate 2 of FIG. 1 that correspond to these numbers, thereby the semiconductor module is repaired. A plurality of electrical wires connected to lead connection parts A, B, E and F, respectively, is formed on the surface of module substrate 2 and is formed so that bare chips 1 and repair chips 3, which are mounted to locations shown in FIG. 1 corresponding to the numbers of the bare chips, are connected to the electrical wires that are connected to the same electrode terminals. For example, a group of electrical wires is provided on module substrate 2 so that it is possible for the input/output terminals, respectively, of repair chip 3a-(1) to be connected to input/output terminals DQ0 to DQ3, respectively, to which the input/output terminals, respectively, of bare chip 1-(1) are connected.

In the case that the lead connection part of repair chip 3a or repair chip 3b is connected to the lead connection part of repair chip 1, it is necessary to prevent bare chip 1, to which the number of the repair chips correspond, from operating and this method is described below.

FIG. 2 is a view showing a condition wherein the semiconductor module is repaired by means of repair chip 3b-(2) in the case that bare chip 1-(2), alone, becomes defective and is a view showing a condition wherein normal leads 10b of a single normal lead product are connected to lead connection parts B and E, shown in FIG. 1.

FIG. 3 is a view showing a condition wherein the semiconductor module is repaired by means of repair chip 3a-(1) in the case that bare chip 1-(1), alone, becomes defective and is a view showing a condition wherein long leads 10a of a single long lead product are connected to lead connection parts A and F, shown in FIG. 1.

FIG. 4 is a view showing a condition wherein the semiconductor module is repaired by using repair chips 3a and 3b, respectively, in place of bare chip 1-(1) and bare chip 1-(2), respectively, and is a view showing a condition wherein long leads 10a of a single long lead product are connected to lead connection parts A and F, shown in FIG. 1, and normal leads 10b of a single normal lead product are connected to lead connection parts B and E, shown in FIG. 1.

Figure 5:
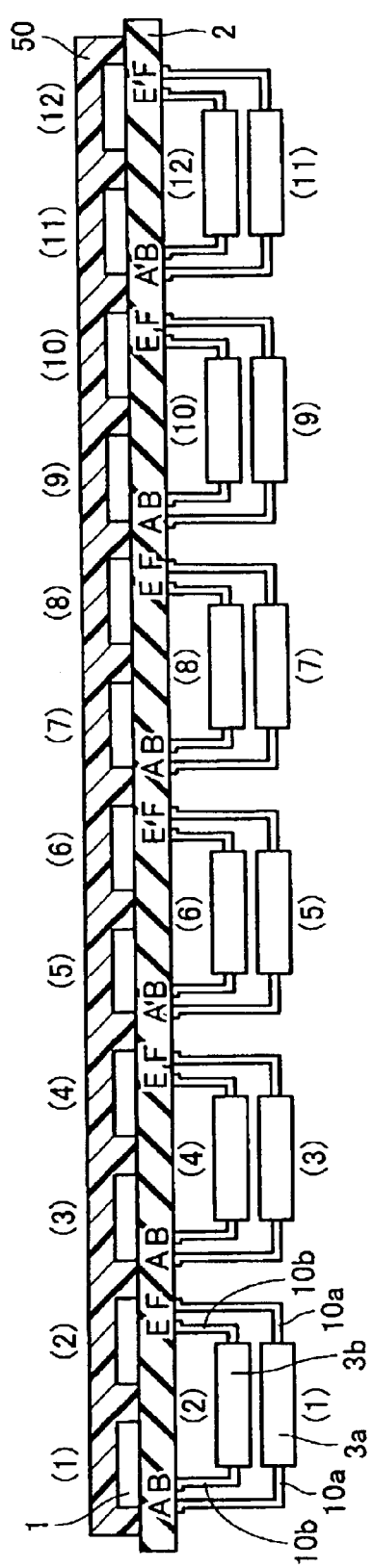

FIG. 5 is a view showing a condition wherein the semiconductor module is repaired by using repair chips 3a, 3b-(1) to (12), respectively, in place of bare chips 1-(1) to (12), respectively, and is a view showing a condition wherein long leads 10a-(1), (3), (5), (7), (9) and (11), respectively, of a single long lead product are connected to lead connection parts A and F of bare chips 1-(1), (3), (5), (7), (9) and (11), respectively, shown in FIG. 1, and normal leads 10b-(1), (3), (5), (7), (9) and (11), respectively, of a single normal lead product are connected to lead connection parts B and E of bare chips 1-(2), (4), (6), (8), (10) and (12), respectively, shown in FIG. 1.

According to the semiconductor module of the present embodiment, it is possible to repair the semiconductor module by properly combining repair chips 3a and 3b, in the case that any bare chip from among the plurality of bare chips 1 becomes defective or in the case that any combination of a plurality of bare chips from among the plurality of bare chips 1 becomes defective and, therefore, the yield of the semiconductor module can be increased.

Though in the semiconductor module of the present embodiment, a combination of a single normal lead product and a single long lead product is used as repair chips forming a stacked structure, the structure of single chips may be in any form as long as the above described object can be achieved.

(Second Embodiment)

A semiconductor module of the present embodiment is described in reference to FIGS. 6 to 10.

Figure 6:
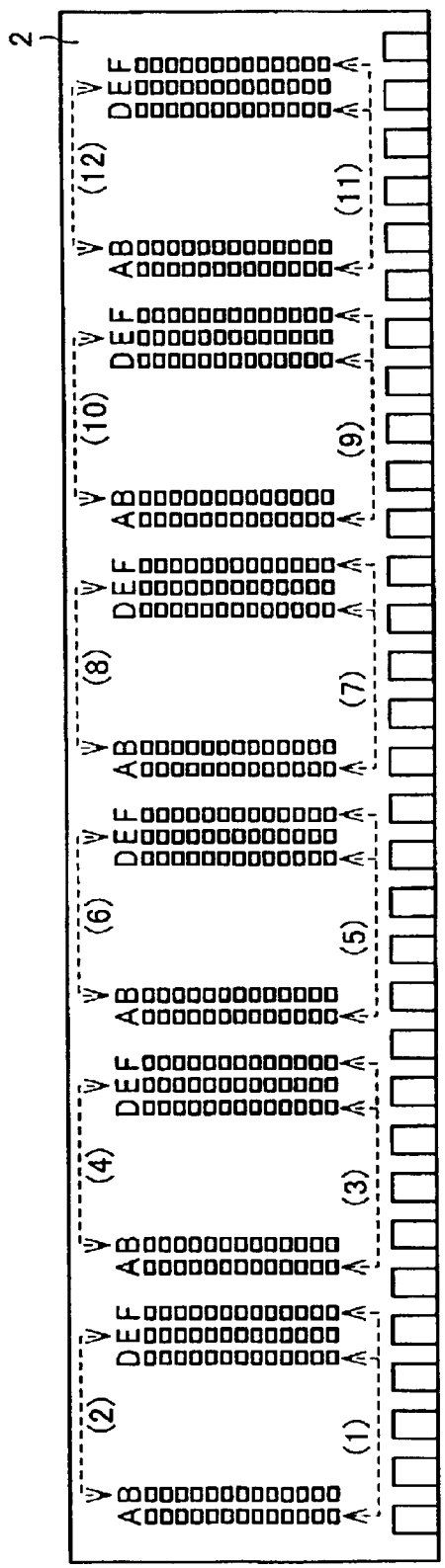
FIGS. 6 to 10 are views for describing a semiconductor module substrate of a second embodiment.

In comparison with the semiconductor module of the first embodiment, lead connection parts D to which normal leads 10b of a normal length of repair chips 3b-(1), (3), (5), (7), (9) and (11) are connected are increased by one column, as shown in FIG. 6, in the semiconductor module of the present embodiment. The pluralities of lead connection parts D and F, respectively, are connected to input/output terminals for input to/output from bare chips 1-(1), (3), (5), (7), (9) and (11) via two types of electrical wires, respectively. The other parts are the same as of the semiconductor module substrate of the first embodiment.

Figure 7:
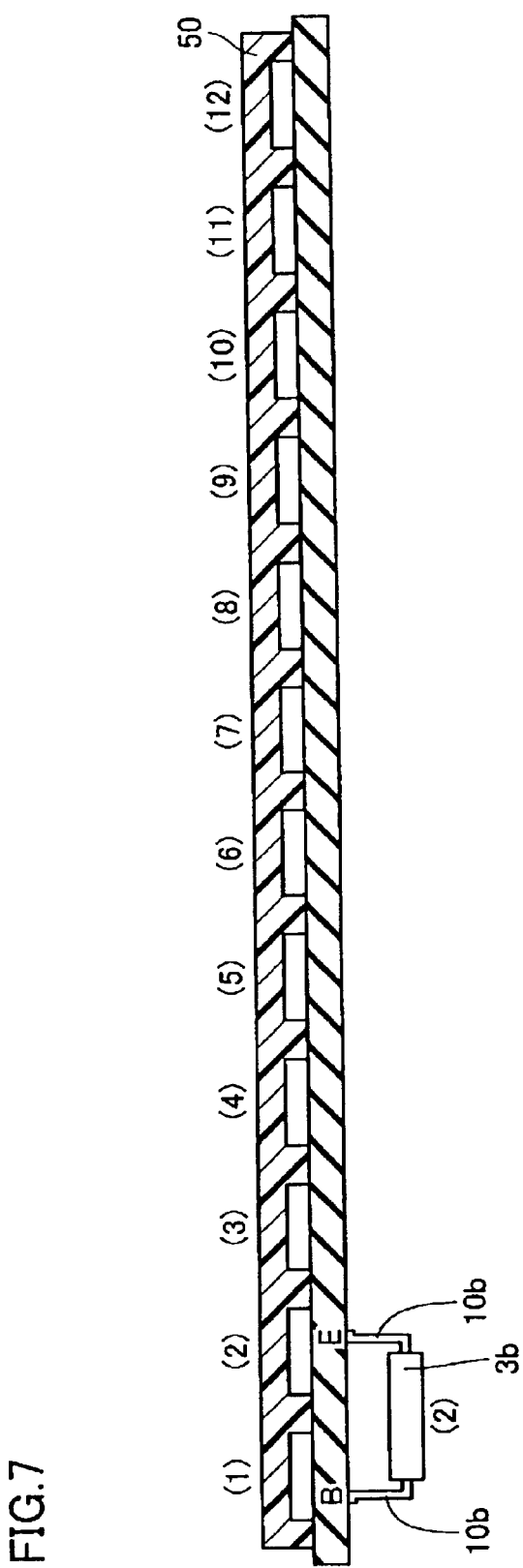

FIG. 7 is a view showing a condition wherein a semiconductor module is repaired by means of repair chip 3b-(2) in the case that bare chip 1-(2), alone, has become defective and is a view showing a condition wherein normal leads 10b of a single normal lead product are connected to lead connection parts B and E, shown in FIG. 6.

Figure 8:
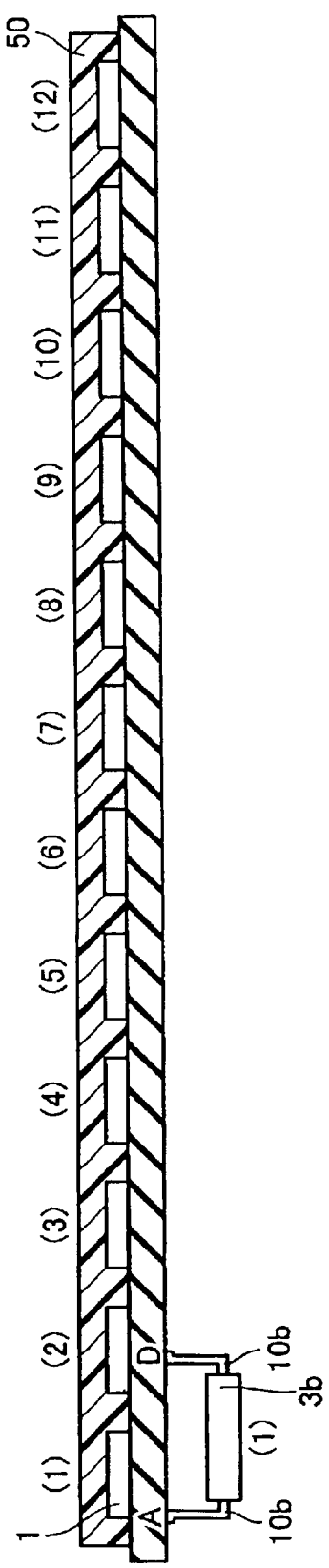

FIG. 8 is a view showing a condition wherein a semiconductor module is repaired by means of repair chip 3b-(1) in the case that bare chip 1-(1), alone, has become defective and is a view showing a condition wherein normal leads 10b of a single normal lead product are connected to lead connection parts A and D, shown in FIG. 6.

Figure 9:
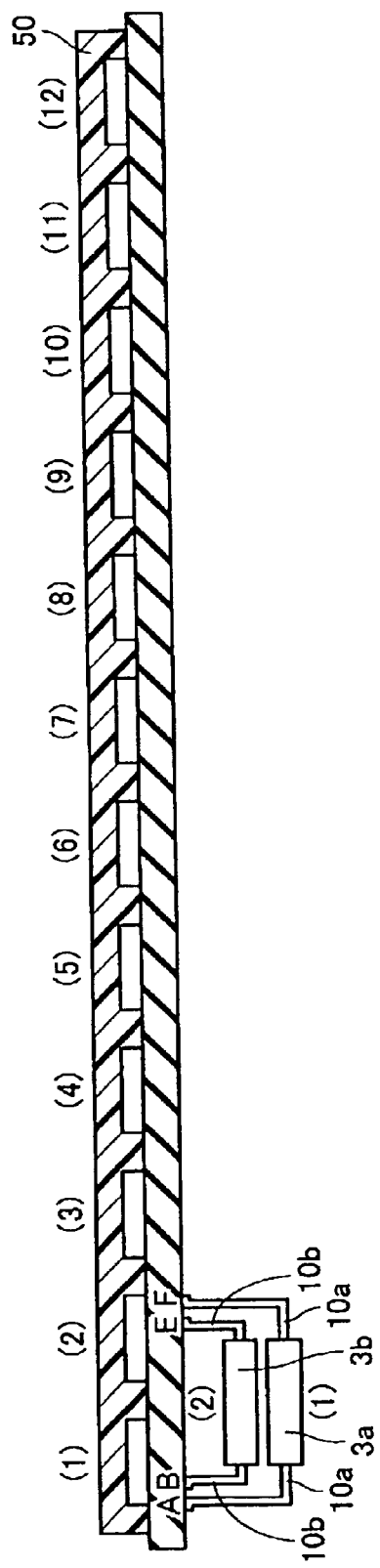

FIG. 9 is a view showing a condition wherein a semiconductor module is repaired by using repair chips 3a and 3b, respectively, in place of bare chip 1-(1) and bare chip 1-(2), respectively, and is a view showing a condition wherein long leads 10a of a single long lead product are connected to lead connection parts A and F, shown in FIG. 6, and normal leads 10b of a single normal lead product are connected to lead connection parts B and E, shown in FIG. 6.

Figure 10:
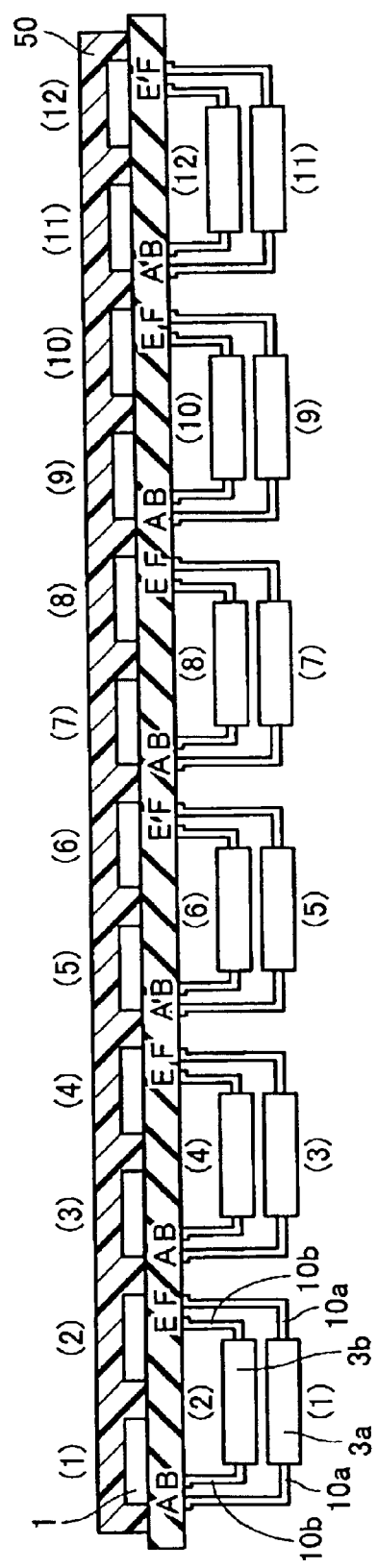

FIG. 10 is a view showing a condition wherein a semiconductor module is repaired by using repair chips 3a, 3b-(1) to (12), respectively, in place of bare chips 1-(1) to (12), respectively, and is a view showing a condition wherein long leads 10a-(1), (3), (5), (7), (9) and (11) of single long lead products are connected to lead connection parts A and F, corresponding to bare chips 1-(1), (3), (5), (7), (9) and (11), respectively, shown in FIG. 6, and normal leads 10b-(1), (3), (5), (7), (9) and (11) of single normal lead products are connected to lead connection parts B and E, corresponding to bare chips 1-(2), (4), (6), (8), (10) and (12), respectively, shown in FIG. 6.

According to the semiconductor module of the present embodiment, it is possible to repair the semiconductor module by properly combining repair chips 3a and 3b in the case that any bare chip from among the plurality of bare chips 1 becomes defective or in the case that a plurality of bare chips of any combination from among the plurality of bare chips 1 becomes defective and, therefore, the yield of the semiconductor module can be increased.

In addition, though in the semiconductor module of the first embodiment it is always necessary to repair the semiconductor module by using a single long lead product in the case that any of bare chips 1-(1), (3), (5), (7), (9) and (11) become defective, according to the configuration of the semiconductor module substrate of the present embodiment, it is possible to repair the semiconductor module by using a single normal lead product alone unless the adjoining bare chips 1-(2), (4), (6), (8), (10) and (12) are defective, in the case that any of bare chips 1-(1), (3), (5), (7), (9) and (11) has become defective and, therefore, the number of single long lead products utilized having a form different from the normal form can be restricted to a minimum.

(Third Embodiment)

The configuration of a semiconductor module of the third embodiment will be described in reference to FIGS. 11 to 13.

Though in the configurations of the semiconductor modules of the first and second embodiments a single chip ("single normal lead product" or "single long lead product") having the same capacity as that of bare chip 1 is used as repair chip 3, according to the semiconductor module of the present embodiment, a double capacity single chip having a capacity two times as large as that of bare chip 1 is utilized in place of a single chip having the same capacity as that of a bare chip. Here, in the present embodiment and in the next embodiment, a single chip having a capacity two times as large as that of bare chip 1 is referred to as a "single double product" and a single chip having the same capacity as that of bare chip 1 is referred to as a "single single product."

Figure 25:
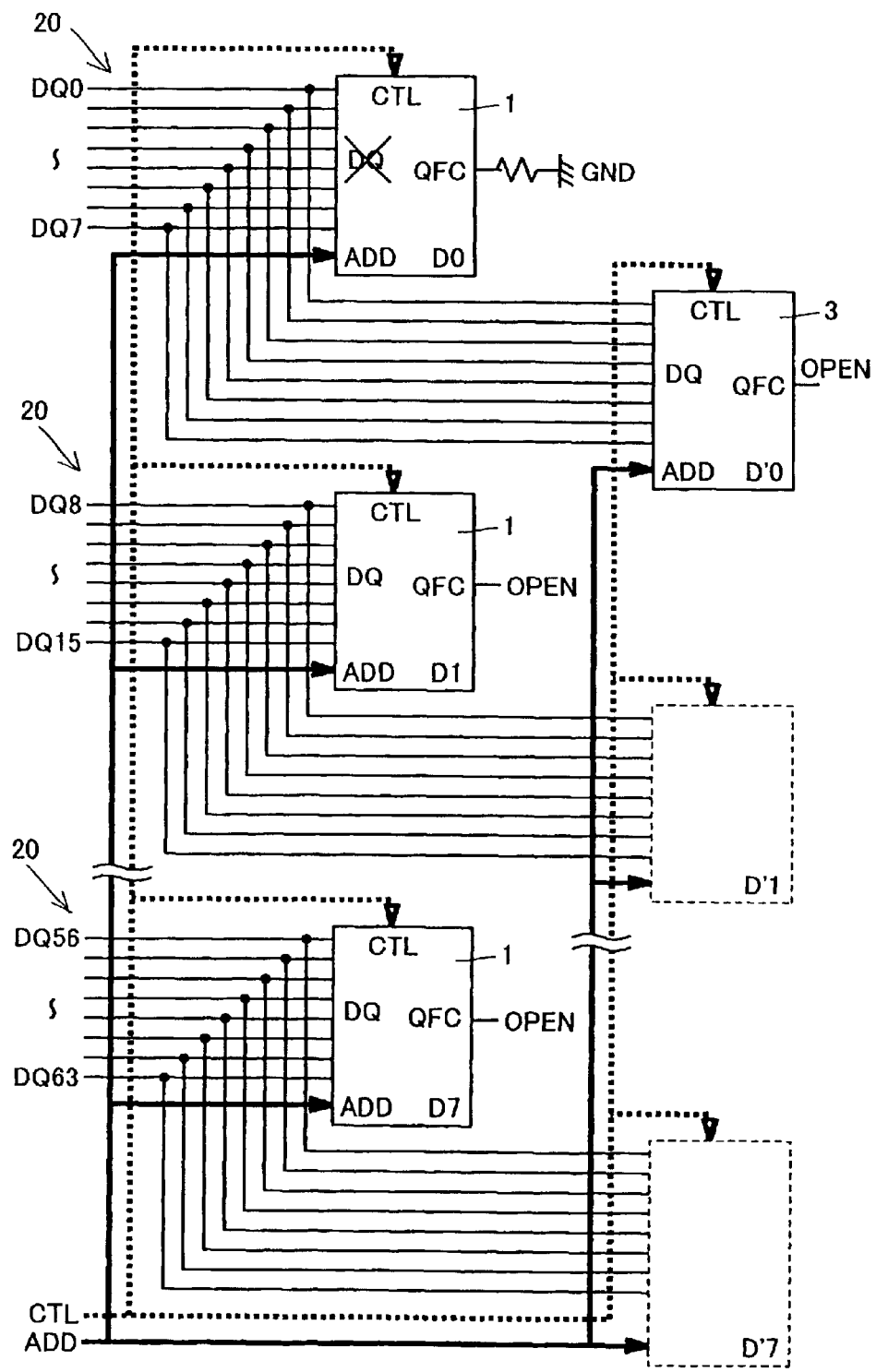
FIG. 25 is a diagram for describing a configuration of a semiconductor module substrate after repair.

In addition, in the semiconductor module of the present embodiment input/output terminals DQ0 to DQ3 of bare chips (1) described below in reference to FIGS. 25 and 26 and input/output terminals DQ0 to DQ3 of single double products (1) and (2) correspond to each other and input/output terminals DQ0 to DQ3 of bare chips (2) described below in reference to FIGS. 25 and 26 and input/output terminals DQ4 to DQ7 of single double products (1) and (2) correspond to each other while the other input/output terminals of bare chip (1) and of bare chip (2), respectively, are formed so as to correspond to the other input/output terminals of single double products (1) and (2) according to the structure of a plurality of electrical wires formed on module substrate 2. In the case that normal leads 10c of repair chip 3c are connected to lead connection parts B and E, the function of bare chip 1 that corresponds to this bare chip 3c is stopped and this method is described below.

Figure 11:
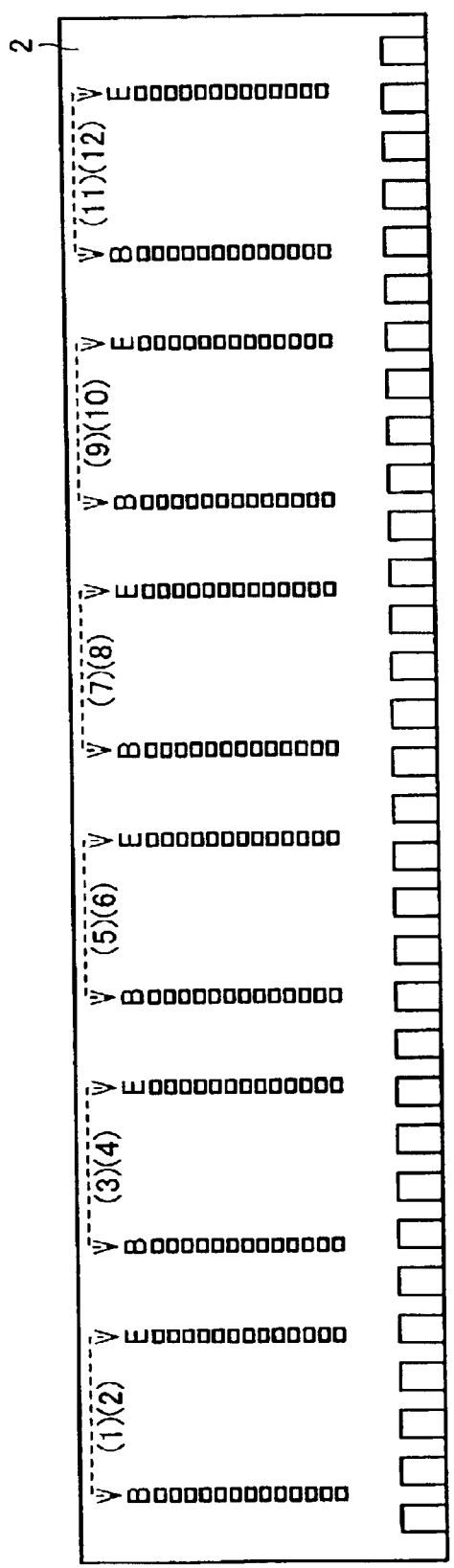
FIGS. 11 to 13 are views for describing a semiconductor module substrate of a third embodiment.
Figure 12:
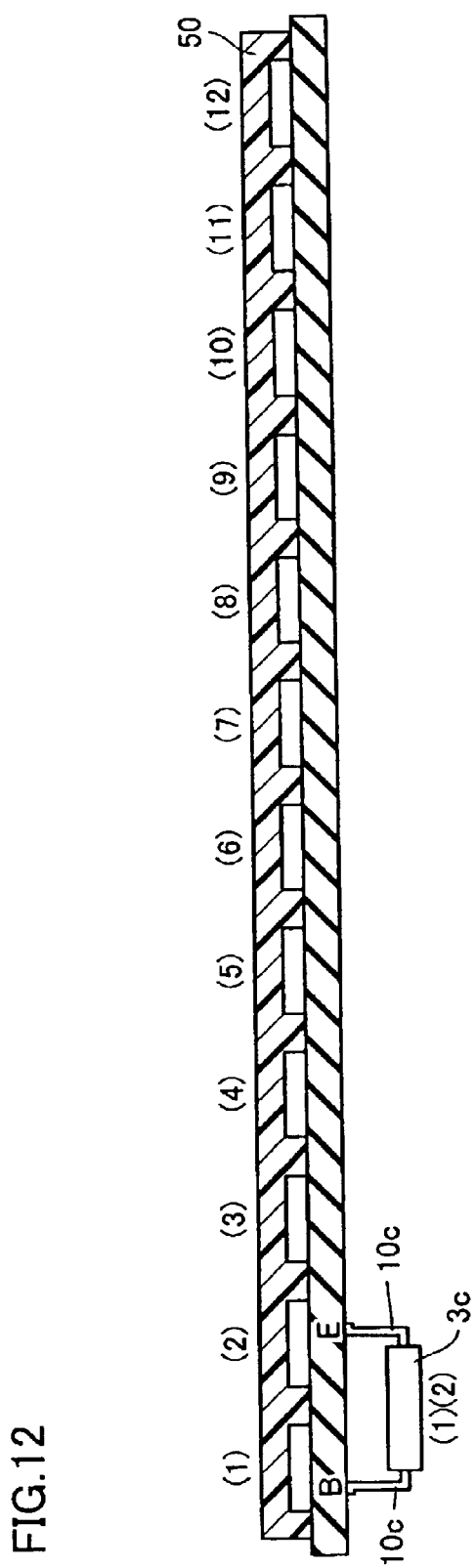

FIG. 12 is a view showing a condition wherein a semiconductor module is repaired using repair chips 3c-(1) and (2) in place of bare chips 1-(1) and (2), respectively, and is a view showing a condition wherein normal leads 10c of a single double product are connected to lead connection parts B and E, shown in FIG. 11.

Figure 13:
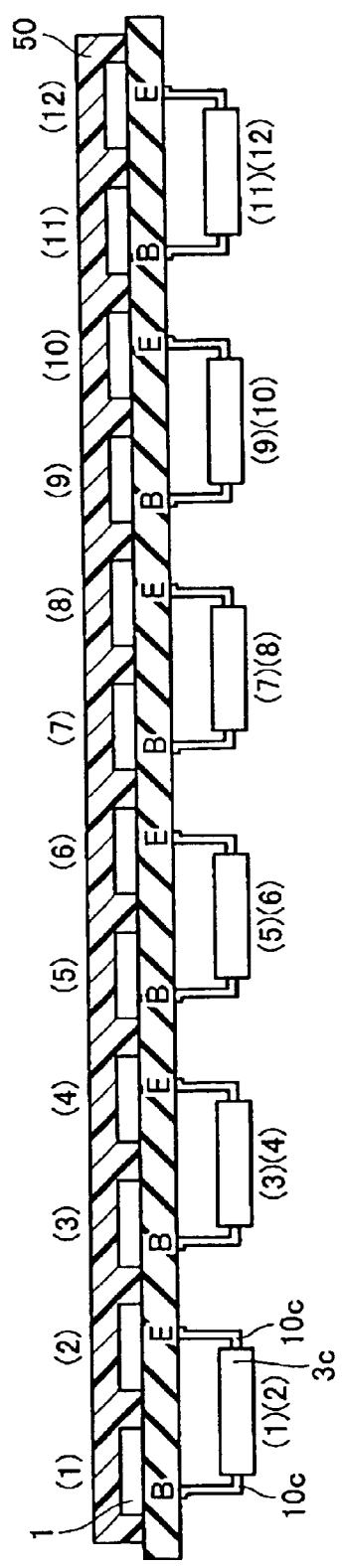

FIG. 13 is a view showing a condition wherein a semiconductor module is repaired by using repair chips 3c-(1), (2) to (11) and (12), respectively, in place of bare chips 1-(1) to (12), respectively, and is a view showing a condition wherein normal leads 10c-(1)(2), (3)(4), (5)(6), (7)(8), (9)(10) and (11)(12), respectively, of single double products are connected to lead connection parts B and E of bare chips 1-(1) to (12), respectively, shown in FIG. 11.

According to the semiconductor module substrate of the present embodiment, it is possible to repair the semiconductor module in the case that any bare chip, alone, from among the plurality of bare chips 1-(1) to (12) or any plurality of bare chips of an arbitrary combination from among the plurality of bare chips 1-(1) to (12) has become defective and, therefore, the yield of the semiconductor module is increased.

In addition, according to the configuration of the semiconductor module substrate of the present embodiment, there is an advantage wherein a single long lead product having a form different from the normal form need not be used, unlike in the semiconductor module substrate of the first embodiment.

(Fourth Embodiment)

A semiconductor module of the present embodiment will be described in reference to FIGS. 14 to 18.

In the semiconductor module of the third embodiment, a single double product must always be used at the time when the semiconductor module is repaired. The semiconductor module of the present embodiment, however, has a structure wherein the semiconductor module can be repaired by using a single single product in the case that bare chip 1, which requires repair, is either bare chip 1-(1) or (2), alone, either bare chip 1-(3) or (4), alone, either bare chip 1-(5) or (6), alone, either bare chip 1-(7) or (8), alone, either bare chip 1-(9) or (10), alone or either bare chip 1-(11) or (12), alone.

Figure 14:
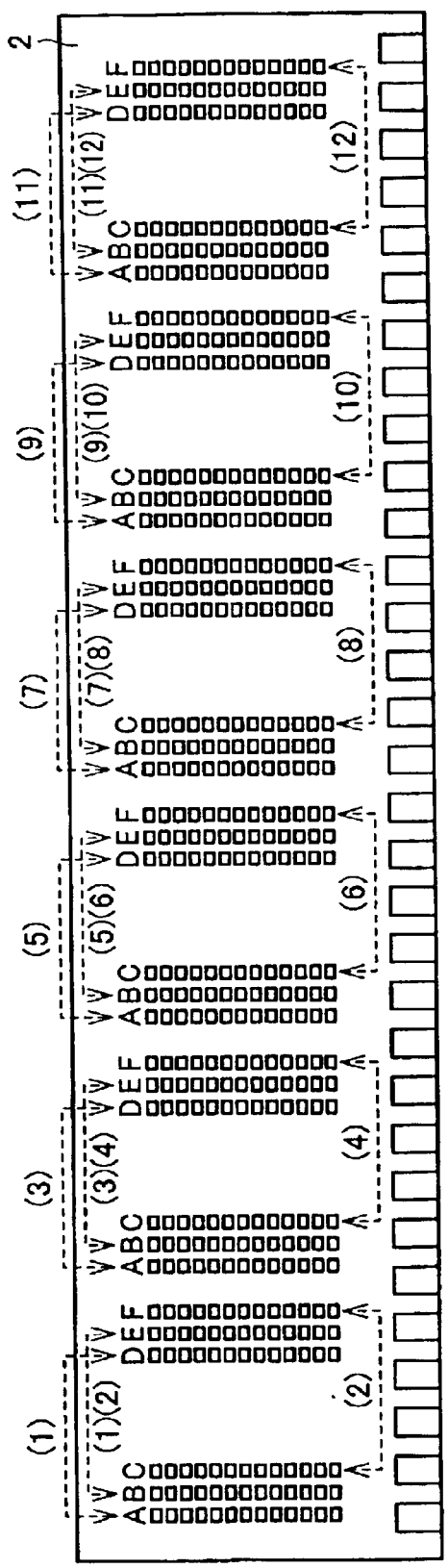
FIGS. 14 to 18 are views for describing a semiconductor module substrate of a fourth embodiment.

Semiconductor module substrate 2 of the present embodiment differs from the semiconductor module substrate of the third embodiment in the point wherein the lead connection parts of the lead frames of all the repair chips are made of six columns of A, B, C, D, E and F, as shown in FIG. 14.

The respective lead connection parts, to which the plurality of electrical wires, respectively, provided on semiconductor module substrate 2 of the present embodiment is connected, have the following configurations.

Electrical wires having the same structures as of the semiconductor module substrate of the third embodiment are connected to lead connection parts B and E. In addition, lead connection parts A and D are connected to the lead frames of repair chips 3c-(1), (3), (5), (7), (9) and (11) while lead connection parts C and F are connected to the lead frames of repair chips 3c-(2), (4), (6), (8), (10) and (12). The other parts of the structure are the same as in the structure of the semiconductor module substrate of the third embodiment.

Figure 15:
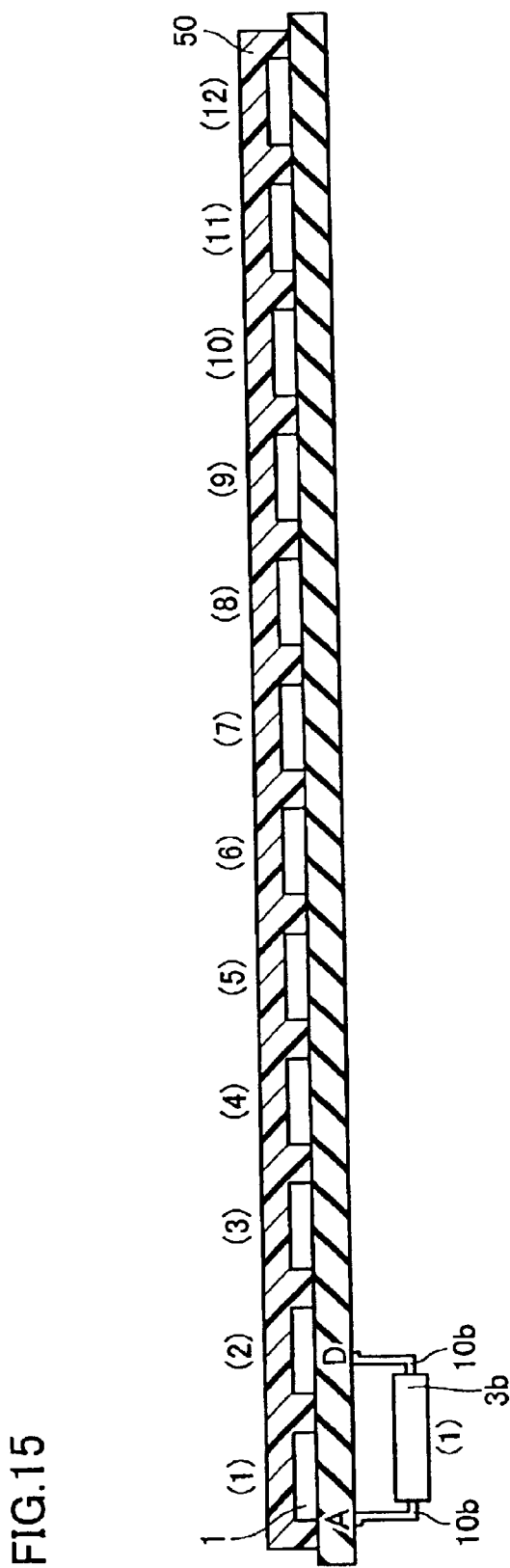

FIG. 15 is a view showing a condition wherein a semiconductor module is repaired by using repair chip 3b-(1) in place of bare chip 1-(1) and is a view showing a condition wherein normal leads 10b of a single single product are connected to lead connection parts A and D, shown in FIG. 14.

Figure 16:
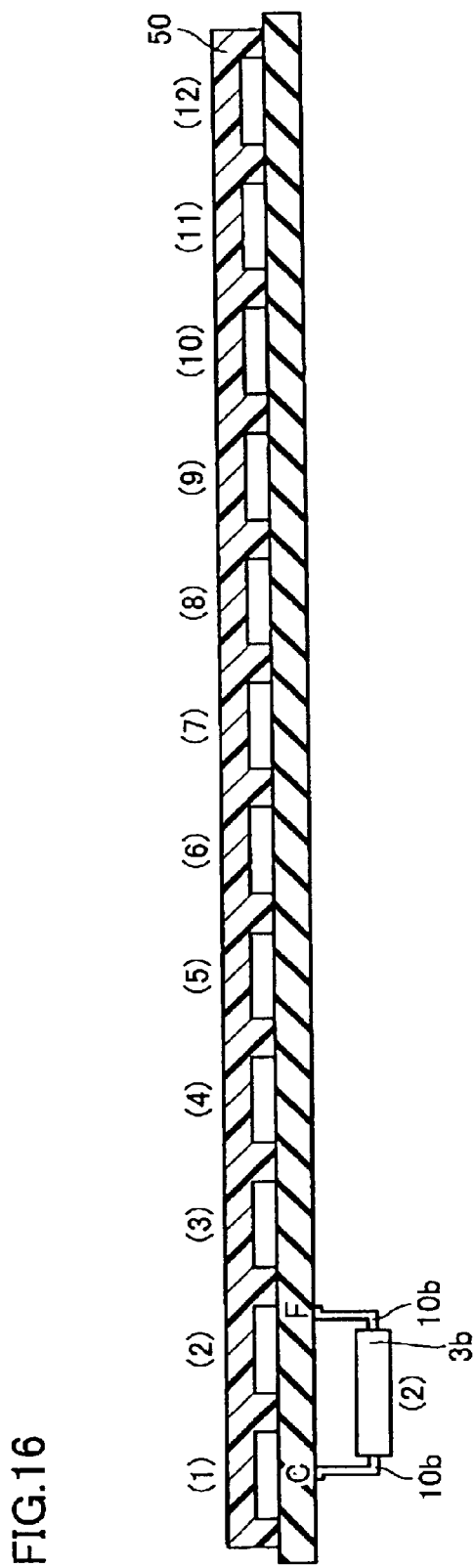

FIG. 16 is a view showing a condition wherein a semiconductor module is repaired by using repair chip 3b-(2) in place of bare chip 1-(2) and is a view showing a condition wherein normal leads 10b of a single single product are connected to lead connection parts C and F, shown in FIG. 14.

Figure 17:
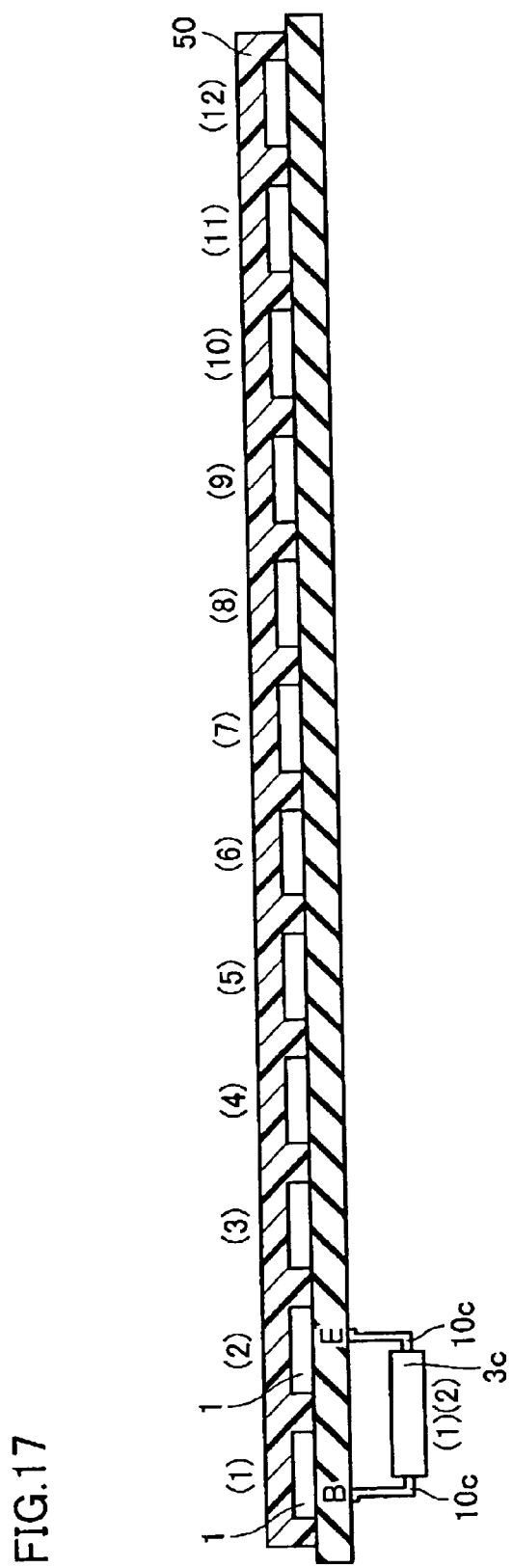

FIG. 17 is a view showing a condition wherein a semiconductor module is repaired by using a repair chip 3c-(1)(2) of a single double product in place of bare chip 1-(1) and bare chip 1-(2), respectively, is a view showing a condition wherein normal leads 10c-(1)(2) of a single double product are connected to lead connection parts B and E of bare chip 1-(1) and bare chip 1-(2), respectively, shown in FIG. 14.

Figure 18:
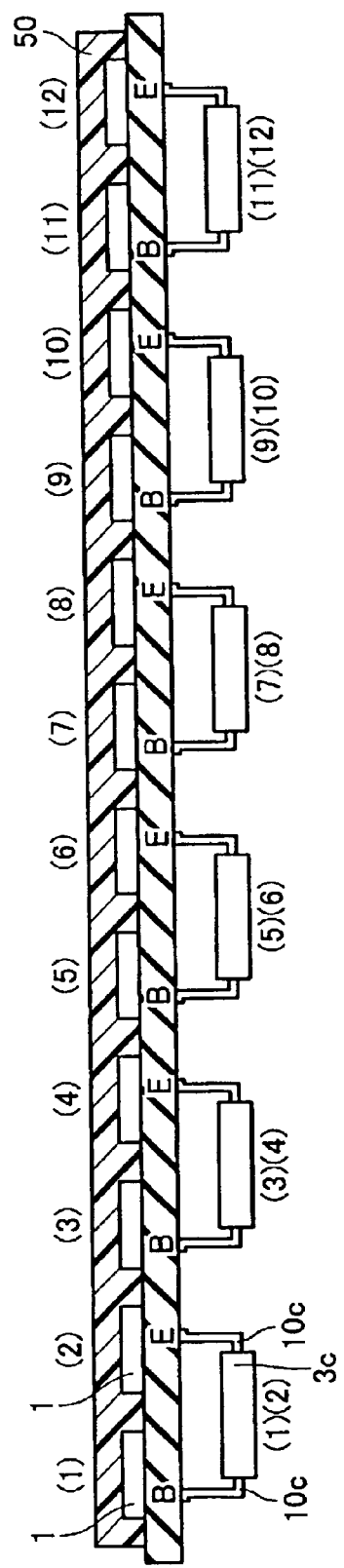

FIG. 18 is a view showing a condition wherein a semiconductor module is repaired by using a repair chip 3c-(1)(2), a repair chip 3c-(3)(4), a repair chip 3c-(5)(6), a repair chip 3c-(7)(8), a repair chip 3c-(9)(10) and a repair chip 3c-(11)(12), respectively, in place of bare chips 1-(1) and (2), bare chips 1-(3) and (4), bare chips 1-(5) and (6), bare chips 1-(7) and (8), bare chips 1-(9) and (10) and bare chips 1-(11) and (12), respectively, and is a view showing a condition wherein normal leads 10b-(1)(2), normal leads 10b-(3)(4), normal leads 10b-(5)(6), normal leads 10b-(7)(8), normal leads 10b-(9)(10) and normal leads 10b-(11)(12), respectively, of single double products are connected to lead connection parts B and E, respectively, shown in FIG. 14.

In the semiconductor module substrate of the third embodiment, repair must be carried out by using a single double product in the case that any bare chip 1 becomes defective. In semiconductor module substrate 2 of the present embodiment, the semiconductor module can be repaired by using a single single product in place of bare chip 1 that has become defective instead of using a single double product in the case that one of the predetermined two bare chips adjoining each other has become defective. Therefore, it becomes possible to maximally reduce costs spent for repair of the semiconductor module.

Next, in reference to FIGS. 19 to 26, a method of repairing the semiconductor modules described in any of the above described the first to fourth embodiments by using a repair chip will be described.

A method of repairing a semiconductor module of the present embodiment is a method of repairing a semiconductor module in the case that a bare chip in the mold is detected as being defective by mounting a repair chip that substitutes for this bare chip to the semiconductor module substrate.

Figure 19:
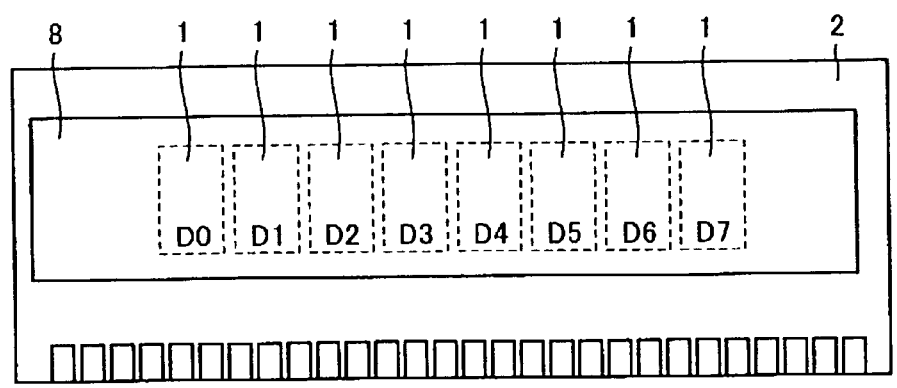
FIG. 19 is a view showing a condition wherein a plurality of bare chips on a semiconductor module substrate is integrally sealed in a mold.

FIG. 19 shows a semiconductor module of the embodiment. As shown in FIG. 19, a plurality of bare chips 1 are directly mounted on one of the main surfaces of a semiconductor module substrate 2 and the plurality of bare chips 1 are integrally sealed in mold resin 8.

Figure 20:
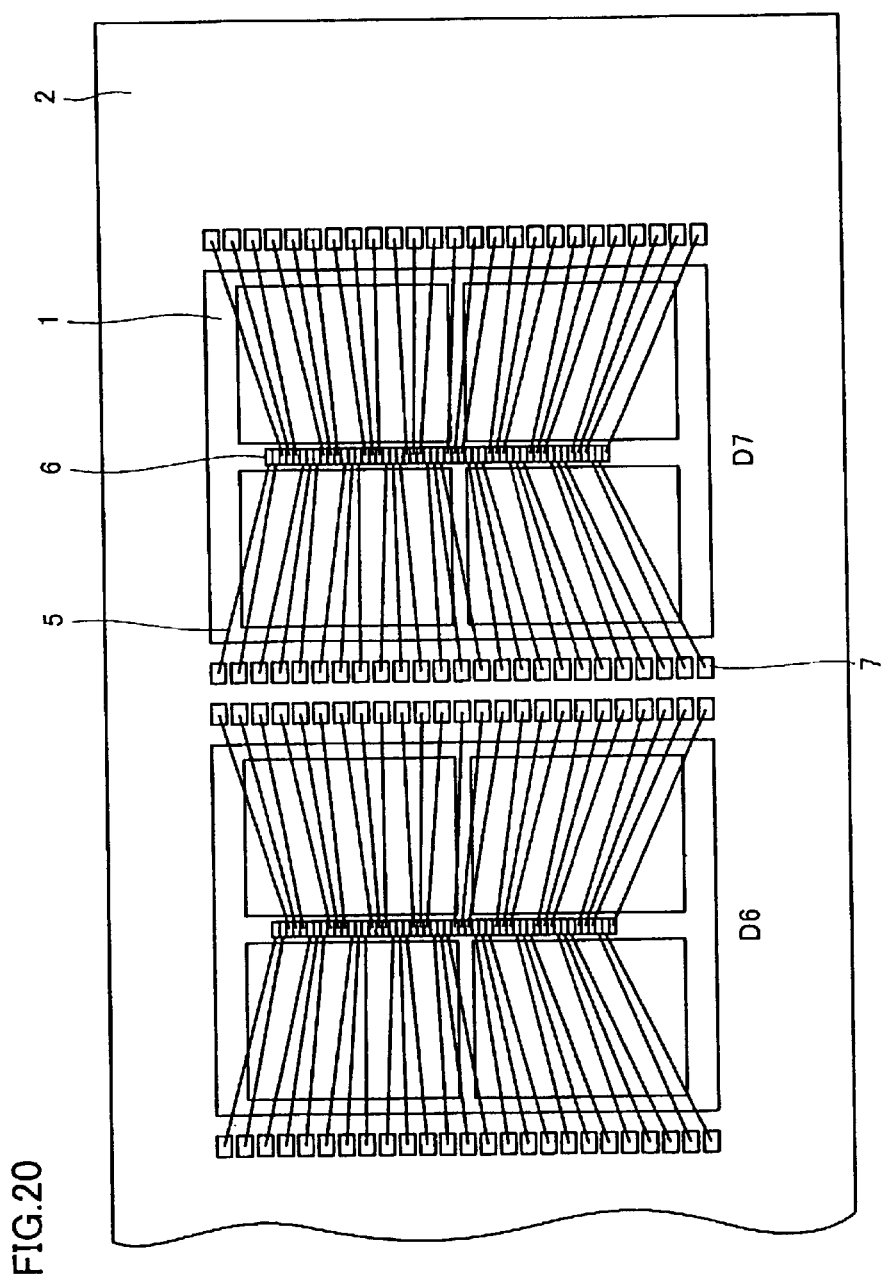
FIG. 20 is a view for describing bare chips mounted on the surface of a semiconductor module substrate.

In addition, as shown in FIG. 20, bonding pads 6 provided on bare chip 1 and wiring pads 7 provided on semiconductor module substrate 2 are connected by means of bonding wires 5.

Figure 21:
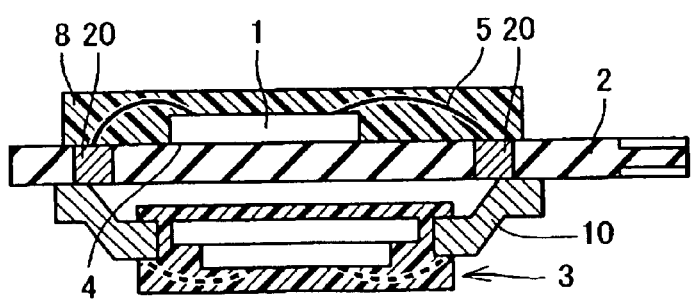
FIG. 21 is a view for describing a cross sectional structure of a semiconductor module.

In addition, the semiconductor module of the embodiment has a structure wherein, in the case that any bare chip 1 from among the plurality of bare chips 1 has been detected as being defective, a repair chip 3 that can be used in place of bare chip 1 can be mounted on the rear side of the main surface on which the plurality of bare chips 1 is provided, as shown in FIG. 21.

A bare chip 1 mounted on the surface of semiconductor module substrate 2 and a good chip that is mounted on the rear surface so as to be used in place of this bare chip 1, as a repair chip 3, utilize shared electrical wires so that, in the case that repair chips 3 are mounted, electrical wires 20 thereof, respectively, are connected to both the plurality of bare chips 1 mounted on the surface and repair chips 3 mounted in a plurality of repair chip mounting regions on the rear surface via through holes that penetrate semiconductor module substrate 2, as shown in FIG. 21.

According to a manufacturing method for a semiconductor module of the present embodiment, after the plurality of bare chips 1 are mounted on semiconductor module substrate 2, bonding pads 6 provided on bare chips 1 and wiring pads 7 provided on semiconductor module substrate 2 are electrically connected by means of bonding wires 5. After that, the plurality of bare chips 1 are integrally sealed in mold resin 8 and, thereby, the semiconductor module is completed. Then, after the completion of the semiconductor module, the structure allows a repair chip 3 in a mold to be mounted on the rear surface of semiconductor module substrate 2 if necessary.

Therefore, in the case that a defect is detected from among the plurality of bare chips 1 in a variety of tests, such as a system test, after the manufacture of a memory module as an example of a semiconductor module, repair chip 3 is mounted on the rear surface of semiconductor module substrate 2 so that repair chip 3 performs the function of bare chip 1 that has become defective, thereby it becomes possible to repair the semiconductor module.

Here, it is necessary to turn off the operation of bare chip 1 that has been detected as being defective in order for repair chip 3 to perform the function of bare chip 1 that has been detected as being defective.

In the semiconductor module substrate of the present embodiment, a signal at a predetermined potential is inputted to a terminal that is not utilized at the time of actual usage and, thereby, ON/OFF of the input/output of bare chip 1 mounted on semiconductor module substrate 2 is controlled so that repair chip 3 performs the function of bare chip 1 that is detected as being defective.

Here, the semiconductor module of the embodiment is integrally molded into mold resin 8, after the plurality of bare chips 1 are mounted on semiconductor module substrate 2 and bonding pads 6 of bare chips 1 and wiring pads 7 of semiconductor module substrate 2 are electrically connected to each other. Therefore, the mounting area for the semiconductor module can be made small.

Figure 22:
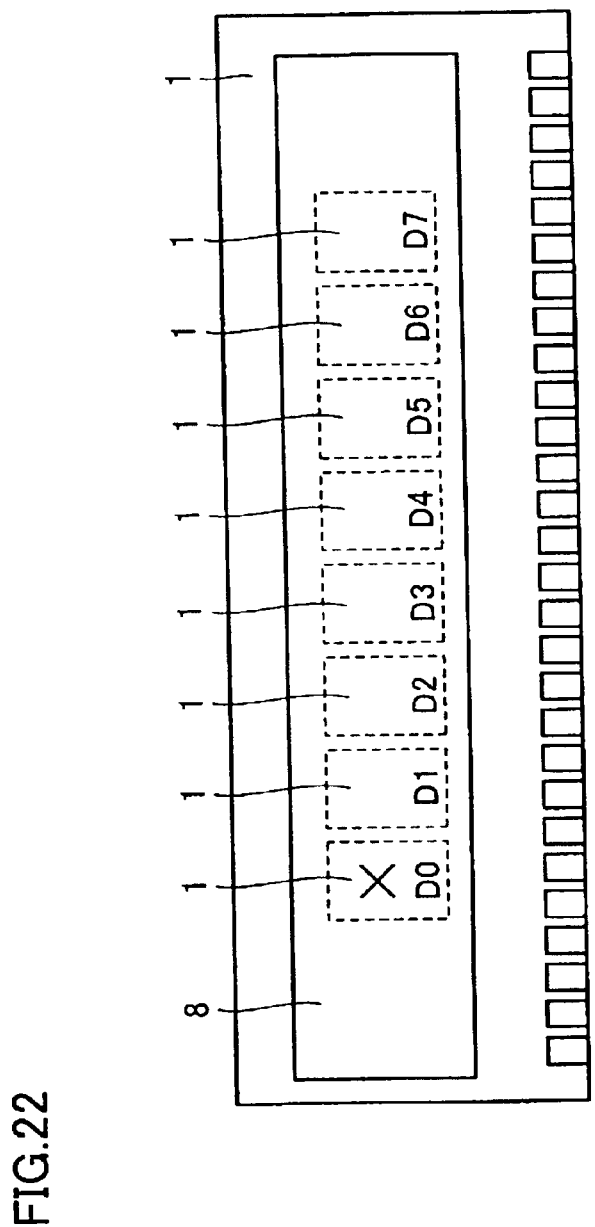
FIG. 22 is a view showing a condition wherein one of bare chips mounted on a semiconductor module substrate has become defective.
Figure 23:
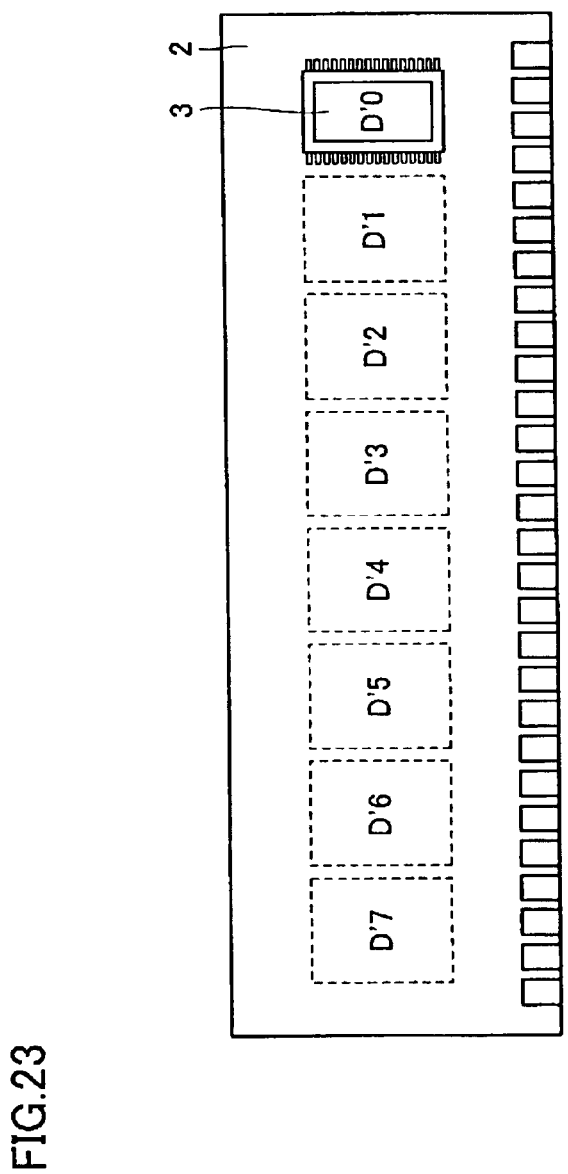
FIG. 23 is a view showing a condition wherein a repair chip mounted on the rear surface of a semiconductor module substrate is utilized so that the semiconductor module is repaired.

FIGS. 22 and 23 show a configuration example of a semiconductor module substrate. As shown in FIGS. 22 and 23, bare chips 1 (D0 to D7) are mounted on the surface of semiconductor module substrate 2 and repair chip mounting regions for good chips 3 (D'0 to D'7) mounted at the time of repair are provided on the rear surface of the semiconductor module.

Figure 24:
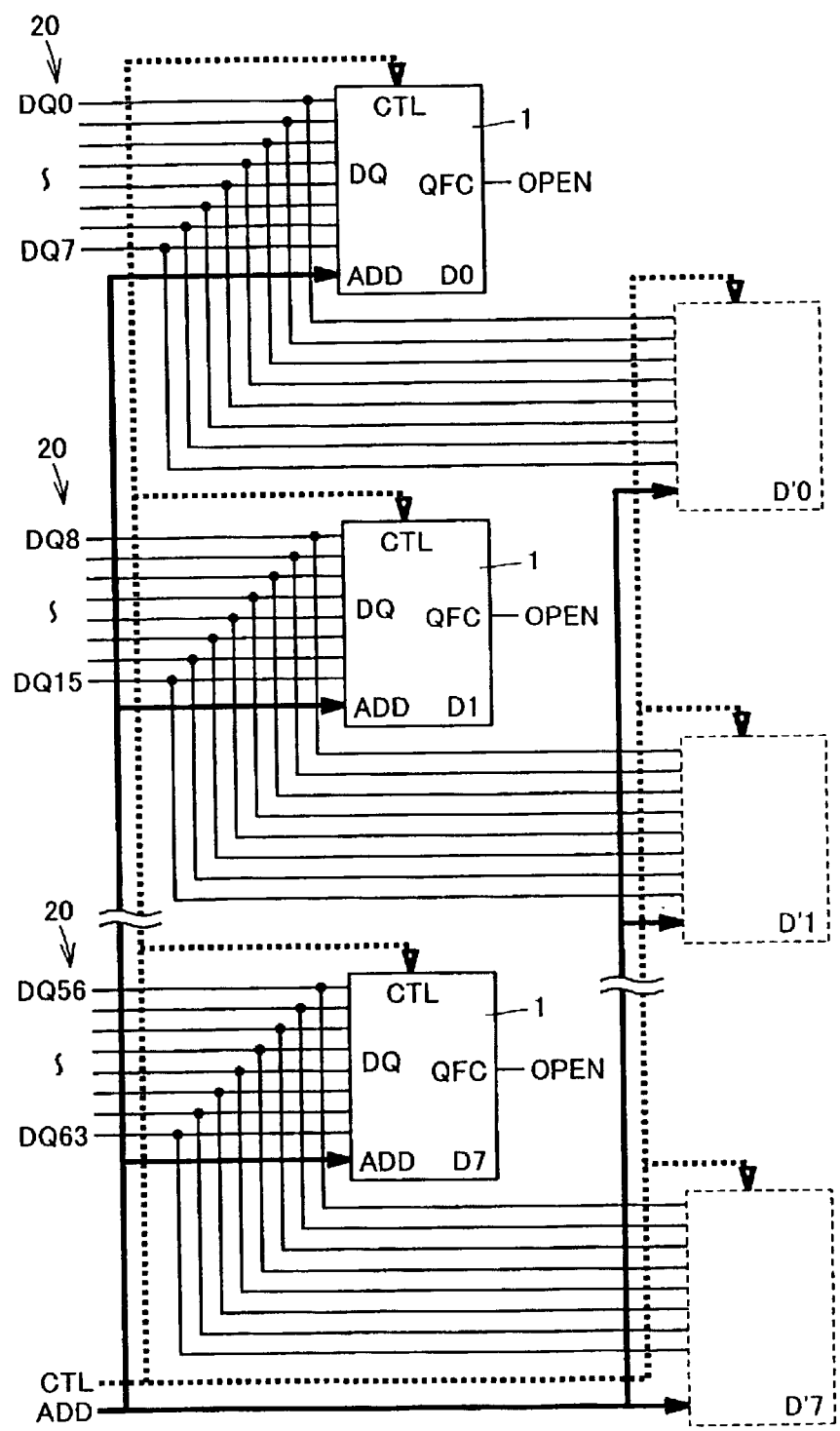
FIG. 24 is a diagram for describing a configuration of a semiconductor module substrate before repair.

FIG. 24 shows a block diagram of the surface of semiconductor module substrate 2, on which bare chips 1 (D0 to D7) are mounted before repair. As shown in FIG. 24, QFC pins (not necessarily limited to QFC pins, only, as long as the pins are terminals that are not normally utilized) for controlling the input/output of bare chip 1 that has been detected as being defective are provided to bare chips 1 (D0 to D7). FIG. 25 shows a block diagram of the front and rear surfaces of module substrate 2 on which a molded single repair chip 3 (D'0 to D'7), which is utilized after repair, is mounted. Here, bare chips 1 (D0 to D7) and repair chip 3 (D'0 to D'7) utilize input/output terminals DQ0 to DQ63 connected to the plurality of shared electrical wires 20, respectively. Here, input/output terminals DQ0 to DQ63 are terminals connected to other circuits or memories for inputting/outputting electrical signals to/from these other circuits or memories.

In the semiconductor module configuration before repair shown in FIG. 24, good chip 3 is not mounted, and therefore there is no problem. In the semiconductor module configuration after repair shown in FIG. 25, however, bare chip 1 (D0) and good chip 3 (D'0) utilize input/output terminals DQ0 to DQ63 connected to the shared electrical wires 20 and, therefore, respective input and output signals of bare chip 1 (D0) and repair chip 3 (D'0) collide, when both bare chip 1 (D0) and repair chip 3 (D'0) operate.

Thus, in the semiconductor module of the embodiment, the QFC pin for bare chip 1 that has been detected as being defective is fixed at a predetermined potential, thereby the input/output of signals from the input/output terminals of this bare chip 1 is disabled so that the above described problem is prevented from occurring. Here, the QFC pin has a structure that is exposed to the outside of mold resin 8 and, therefore, it is possible to fix the QFC pin at a predetermined potential from the outside even after bare chip 1 is covered with mold resin 8. In addition, the circuit configuration of the inside of bare chip 1 is a circuit configuration wherein input/output of electrical signals from/to the input/output terminals of bare chip 1 is not carried out when the potential of the QFC pin is fixed at a predetermined potential.

Figure 26:
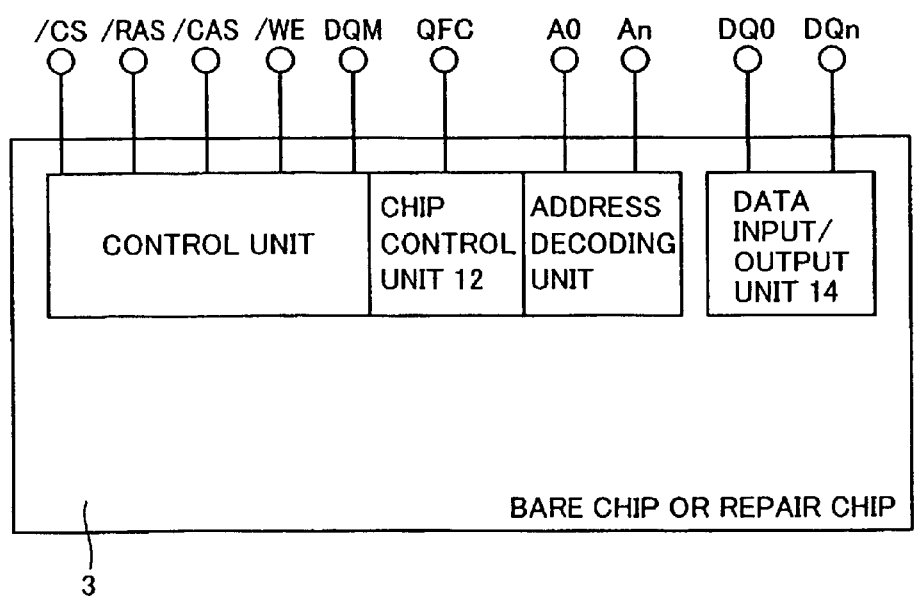
FIG. 26 is a diagram for describing a configuration of the inside of a bare chip.
Figure 27:
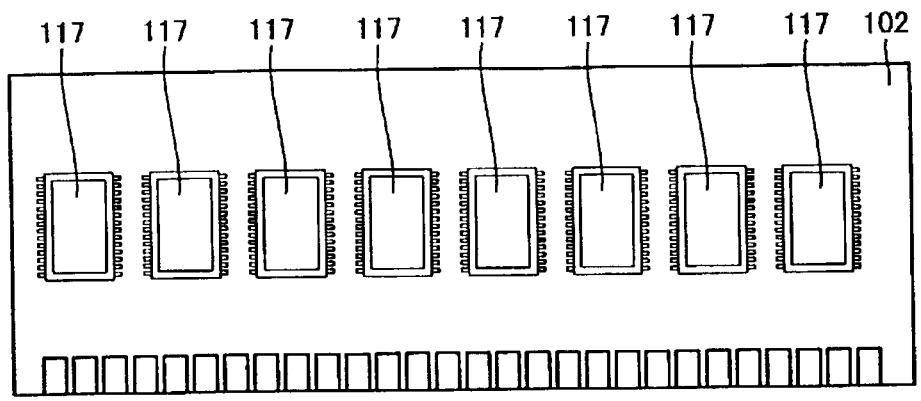
FIG. 27 is a view for describing a configuration on the rear surface of a semiconductor module substrate according to a prior art.
Figure 28:
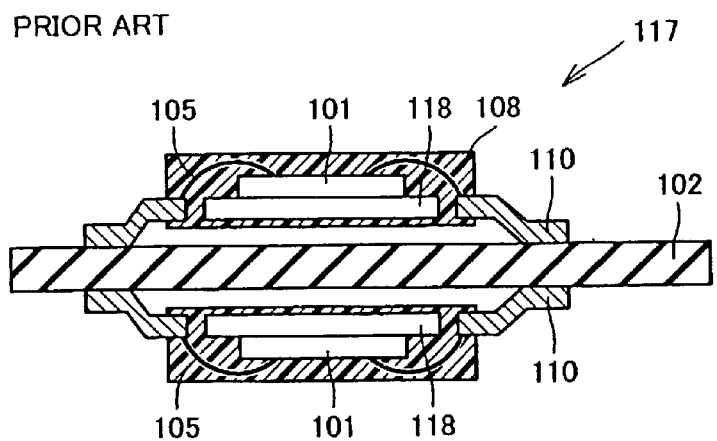
FIG. 28 is a view for describing a cross sectional structure configuration of the semiconductor module substrate according to the prior art.
Figure 29:
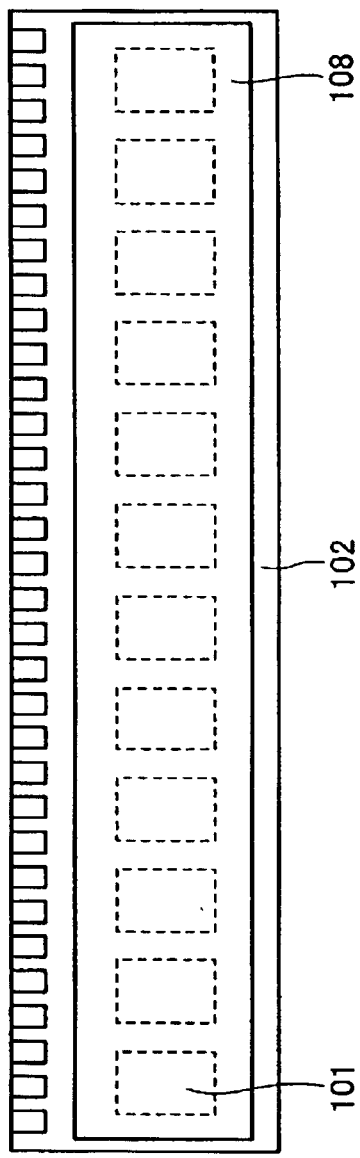
FIG. 29 is a view showing a condition wherein a plurality of bare chips mounted on a semiconductor module substrate is integrally sealed in a mold.
Figure 30:
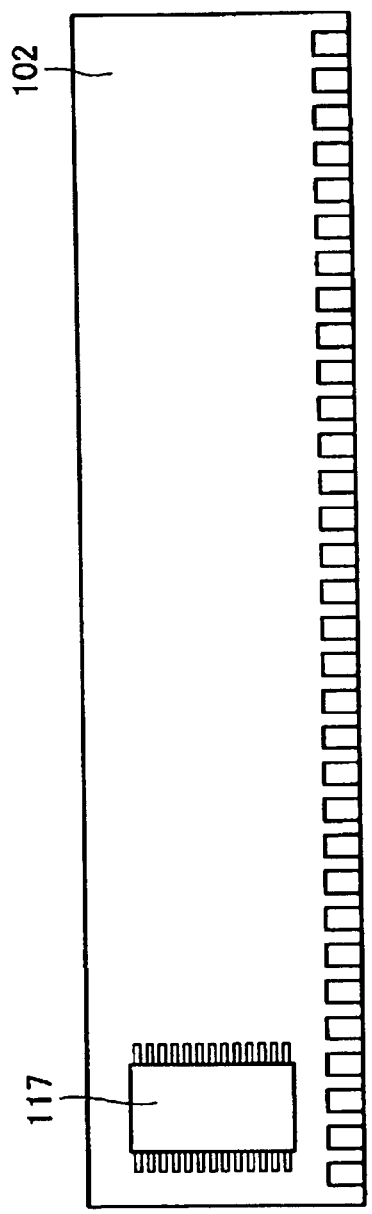
FIG. 30 is a plane view for describing a condition wherein a repair chip is mounted on the rear surface of a semiconductor module substrate.
Figure 31:
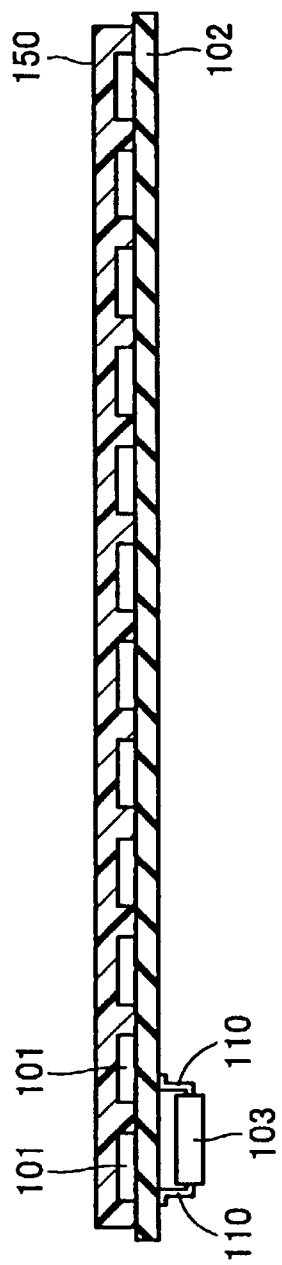
FIG. 31 is a cross sectional view showing that a repair chip is mounted on the rear surface of a semiconductor module substrate.
Figure 32:
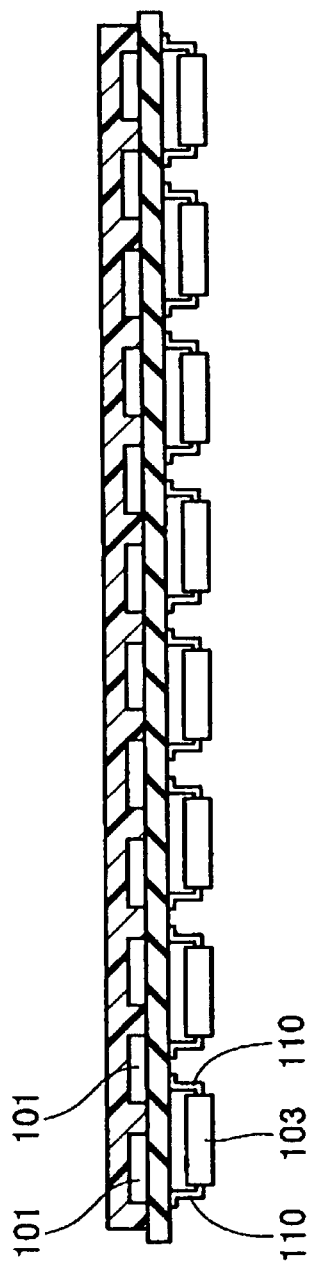
FIG. 32 is a cross sectional view for describing a condition wherein a plurality of repair chips is mounted on the rear surface of a semiconductor module substrate.

In the case that the QFC pin is OPEN, as shown in FIG. 24, for example, bare chip 1 (D0 to D7) or good chip 3 (D'0 to D'7) outputs an electrical signal from an input/output unit 14, shown in FIG. 26, to DQ0 to DQ63 or inputs an electrical signal from DQ0 to DQ63 to input/output unit 14, shown in FIG. 26, due to the operation of a chip control unit 12, shown in FIG. 26. In the case that the QFC pin is fixed at the ground potential (GND), bare chip 1 (D0 to D7) or repair chip 3 (D'0 to D'7) stop the input of a signal from the input/output terminals or the output of a signal from the input/output terminals using input/output unit 14, shown in FIG. 26, due to the operation of chip control unit 12, shown in FIG. 26.

Accordingly, in the case that no bare chips 1 have been detected as being defective, it is not necessary to mount repair chip 3 (D'0 to D'7) and it becomes possible to implement a semiconductor module wherein the plurality of bare chips 1 are directly mounted on semiconductor module substrate 2. In addition, the QFC pins that are not utilized at the time of actual operation in bare chips 1 (D0 to D7) are normally controlled to become OPEN by means of chip control unit 12 at the time of the operation of the semiconductor device so as to output a signal from bare chip 1 (D0 to D7) to input/output terminals DQ0 to DQ63 or so as to input a signal from input/output terminals DQ0 to DQ63 to bare chip 1 (DQ).

Furthermore, in the case that bare chip 1 has been detected as being defective from among bare chips 1 (D0 to D7) in the semiconductor module, repair chip 3 (D'0 to D'7) is mounted on the rear surface of the surface of semiconductor module substrate 2 wherein bare chips 1 are provided and the QFC pin of bare chip 1 (D0) is fixed at the ground potential (GND), thereby bare chip 1 stops the output of a signal to input/output terminals DQ0 to DQ7 or stops the input of a signal from input/output terminals DQ0 to DQ7. Thereby, repair chip 3 (D'0) outputs an electrical signal to input/output terminals DQ0 to DQ7 or inputs an electrical signal from input/output terminals DQ0 to DQ7. Accordingly, repair chip 3 takes over (replace) the function of defective bare chip 1 so that the semiconductor module can be repaired.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor module comprising:
   a semiconductor module substrate;
   a plurality of bare chips mounted on a main surface of the semiconductor module substrate; and
   a mold resin for covering said plurality of bare chips together with the main surface of said semiconductor module substrate, wherein
   said semiconductor module substrate includes:
       a plurality of repair chip mounting regions provided outside of said mold resin to which repair chips having input/output terminals and being usable in place of said plurality of bare chips, respectively, can be mounted; and
       a plurality of electrical wires which, in the case that any of said plurality of bare chips is detected as being defective and a repair chip is mounted on any of said plurality of repair chip mounting regions, are connected to said input/output terminals of the mounted repair chip so that an electrical signal that have been inputted to or outputted from said bare chip that has been detected as being defective is inputted to or outputted from said mounted repair chip via the input/output terminals, and
       said plurality of electrical wires are formed so as to be connectable to said input/output terminal of said repair chip that is used in place of an arbitrary bare chip selected from among said plurality of bare chips or to said respective input/output terminals of said repair chips that are used in place of bare chips, respectively, making up an arbitrary combination selected from among said plurality of bare chips.

2. The semiconductor module according to claim 1, wherein
   said repair chip is a single repair chip wherein a bare chip of the same type as said bare chip is sealed in resin and a lead frame is provided, and
   said plurality of electrical wires are formed, in the case that a stacked structure is provided so that said single repair chip is mounted so as to be overlapped in the direction perpendicular to the main surface of said module substrate, so as to allow the connections with said respective input/output terminals of the single repair chip having the stacked structure.

3. The semiconductor module according to claim 2, wherein
   said plurality of electrical wires are formed so as to allow two single repair chips that are mounted by being overlapped in said stacked structure to be used in place of said predetermined two bare chips adjoining each other.

4. The semiconductor module according to claim 2, wherein
   a normal single repair chip having a lead frame of a predetermined length and a long single repair chip having a lead frame longer than the predetermined length are used in said stack structure, and
   said plurality of electrical wires are formed so that, in the case that a repair chip is utilized in place of only one of the bare chips from among said predetermined two bare chips adjoining each other, it is possible to use a normal single repair chip in place of either one of the bare chips.

5. The semiconductor module according to claim 1, wherein
   said repair chip is a single repair chip wherein said bare chip is sealed in resin and a lead frame is provided and is a double capacity repair chip having a memory capacity two times as large as said bare chip, and
   said plurality of electrical wires are formed so as to be connectable to said input/output terminals of said double capacity repair chip that is used in place of any two bare chips from among said plurality of bare chips.

6. The semiconductor module according to claim 5, wherein
   said plurality of electrical wires are formed so that it is possible to use said double capacity repair chip in place of said predetermined two bare chips adjoining each other.

7. The semiconductor module according to claim 5, wherein
   said plurality of electrical wires are formed so as to be connectable to either a same capacity repair chip having the same memory capacity has the memory capacity of said bare chip or said double capacity repair chip, and
   said plurality of electrical wires is formed so that, in the case that a repair chip is utilized in place of only one bare chip of either of said predetermined two bare chips adjoining each other, it is possible to use said same capacity repair chip in place of either bare chip.

8. The semiconductor module according to claim 1, wherein
   said mold resin integrally covers the entirety of said plurality of bare chips.

* * * * *